United States Patent
Yunus

(10) Patent No.: US 6,341,091 B1
(45) Date of Patent: Jan. 22, 2002

(54) METHOD AND SYSTEM FOR TESTING A BIT CELL IN A MEMORY ARRAY

(75) Inventor: Mohammad Yunus, Fremont, CA (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/707,492

(22) Filed: Nov. 6, 2000

(51) Int. Cl.$^7$ ................................................. G11C 7/00
(52) U.S. Cl. .................................. 365/201; 365/189.09
(58) Field of Search ............................. 365/201, 189.09

(56) References Cited

U.S. PATENT DOCUMENTS 4,429,388 A * 1/1984 Fukushima et al. ........... 371/21

* cited by examiner

Primary Examiner—Trong Phan
Assistant Examiner—M. Tran
(74) Attorney, Agent, or Firm—Russell E. Baumann; Frederick J. Telecky, Jr.

(57) ABSTRACT

A method for testing a cell in a device for reliability is disclosed. The cell us coupled to a reference voltage and a current source. The method and system comprises measuring a mirrored current through the device at first predetermined gate voltage and measuring a mirrored current through the device at a second predetermined voltage. The method and system includes determining the threshold voltage of the cell and heating the device for a predetermined period of time. Finally, the method and system includes calculating a new threshold voltage if the measured mirrored current is different from the previously measured current. Accordingly, a system and method in accordance with the present invention addresses this drift problem by testing the characteristics of the memory array on a bit by bit basis. A system and method in accordance with the present invention includes a mirrored current source arrangement. The mirrored current source arrangement allows for the determination of the overall change in characteristic of the threshold voltage. In so doing, the device can be tested more accurately and quickly, thereby reducing the time for testing and increasing the reliability of the device.

12 Claims, 7 Drawing Sheets

METHOD AND SYSTEM FOR TESTING A BIT CELL IN A MEMORY ARRAY

FIELD OF THE INVENTION

The present invention relates generally to programming of a memory and more particularly to a system and method for reliably programming such a memory.

BACKGROUND OF THE INVENTION

When testing memory cells in a memory array such as an EEPROM array, there are three different time periods that tests are performed to determine whether the bit cells are being read properly. The first time period is when the array is in the fabrication or manufacturing area. The second time period is when the array is in a product, as part of a circuit. The third time period is when the circuit is part of an overall system, as in a sensor.

In the fabrication time period, typically the functionality of the device is tested via a test pattern on the scribe. In this time period, the circuit is tested is tested on a test die. Typically a go/no-go test is utilized, that is, it is determined if a bit cell is being read properly when the test voltage is above a first threshold voltage and when the test voltage is below a second threshold voltage. In addition, only specified areas of the test die are tested and therefore there may be some areas on the die that cannot be read.

During the second time period when the array is part of the circuit, selected bits in the EEPROM are tested typically for data retention. This is typically also a go or no-go test. This test is not performed on a bit by bit basis.

Finally, in the third time period when the circuit is part of a device or system, the device is programmed according to data sheet specification, and there may be a sample quality test to determine if there is data retention. There is typically no test to ensure correct voltage and there is no test for any marginal bit performance within a device. Typically, there is a high cost if there is a failure and so the way failure mode is addressed is through additional redundancy in the memory to minimize the failure mode. During all of the above time periods defective arrays may occur because some of the bit cells can not be properly read.

Accordingly, what is desired is that in the circuit and sensor test and calibration environment, each bit can be tested for threshold voltage. Also, it is important to reduce the overall time required to test the device. Finally, it is important to reduce the amount of redundancy, thereby saving silicon area. The present invention addresses such a need.

SUMMARY OF THE INVENTION

A method for testing a cell in a device for reliability is disclosed. The cell us coupled to a reference voltage and a current source. The method and system comprises measuring a mirrored current through the device at first predetermined gate voltage and measuring a mirrored current through the device at a second predetermined voltage. The method and system includes determining the threshold voltage of the cell and heating the device for a predetermined period of time. Finally, the method and system includes calculating a new threshold voltage if the measured mirrored current is different from the previously measured current.

Accordingly, a system and method in accordance with the present invention addresses this drift problem by testing the characteristics of the memory array on a bit by bit basis. A system and method in accordance with the present invention includes a mirrored current source arrangement. The mirrored current source arrangement allows for the determination of the overall change in characteristic of the threshold voltage. In so doing, the device can be tested more accurately and quickly, thereby reducing the time for testing and increasing the reliability of the device.

DETAILED DESCRIPTION

The present invention relates generally to programming of a memory and more particularly to a system and method for reliably programming such a memory. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1A:
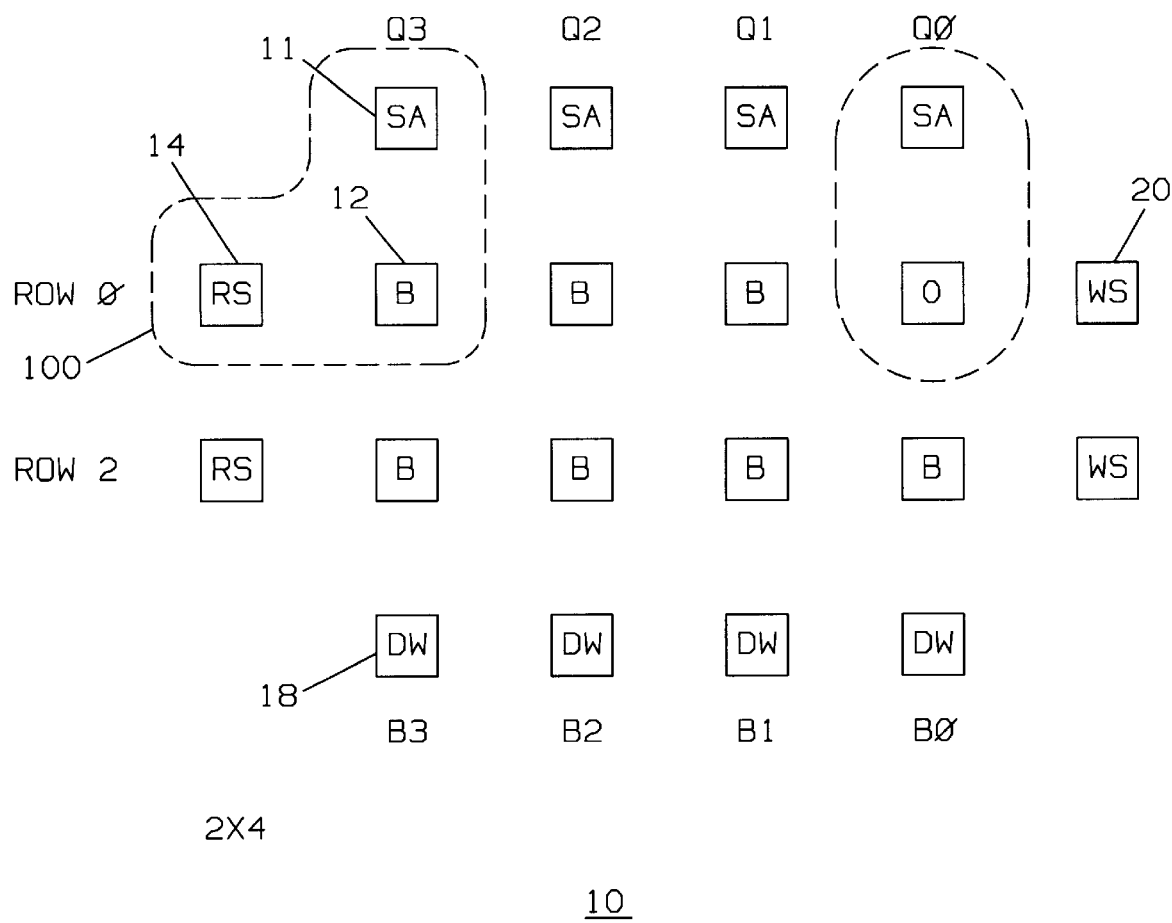
FIG. 1a illustrates a typical EEPROM array.

To describe the problems associated with this testing memory arrays, refer now first to FIG. 1a, which is a typical EEPROM array 10. In this case the array 10 is a 2 by 4 row array. The EEPROM array 10 is being disclosed as a preferred embodiment of the present invention, but a system in accordance with the present invention can be utilized with any memory device in which the threshold voltage must be monitored. Accordingly, any threshold voltage where there is a change in the characteristic when testing the device, the present invention would be applicable.

The EEPROM array 10 comprises a plurality of bit cells, in this case, two rows of bit cells 12, two read select elements 14, two write select elements 20, data write elements 18 and sense amplifiers 16. The characteristics of the array 10 is that it can be programmed or written by rows and the array can be read by rows. The critical element of the array is that the reading must be done accurately, to ensure that the proper information is obtained. Accordingly, what is important is that the correct data must always be read after being programmed.

As before mentioned, the bit cells are tested to determine if the bit cells of the array all are operating at either of the one level or another, that is, in a go/no-go fashion. Hence, for example, in one state the threshold voltage (Vth) bit cell may less than zero volts (0 state) and another state the $V_{th}$ of the bit cell is greater than 7 volts (0 state). Conventionally, these two voltage points are tested to determine if the bit cell is being read properly. However, the problem with the go/no go test is that only one point is being looked at, and although information is provided that the bit cell is being read properly at these voltage points, what has been discovered is that a drift over time in the threshold voltage also can be an indication that a bit cell can not be read accurately.

Since this drift is not adequately detected in a conventional system, the bit cells of arrays that may be defective under certain conditions will not be detected. Therefore, bit cells in which threshold voltage is shifting can pass through initial testing and until it gets to the user of the device embedded in a system such as a sensor or the like will the problem be detected. This can create catastrophic problems in the event that the particular sensor fails. For example, if the sensor is utilized in the automotive market, it may be used to detect some critical component of the automobile that could malfunction in a manner that would cause injury or death.

One of the ways that the above-identified drift problem is addressed is by increasing the amount of time or increasing the temperature that the device is tested. In so doing it can be determined if the array can be made to fail. By adding additional time such as increasing the time by several days and increasing the temperature from 300–400 degrees C., the cost and complexity to the system is increased. Another solution is to add redundancy to the array to allow for a certain percentage of the arrays to be defective. Redundancy also adds to the overall cost and size of the system.

Figure 1B:
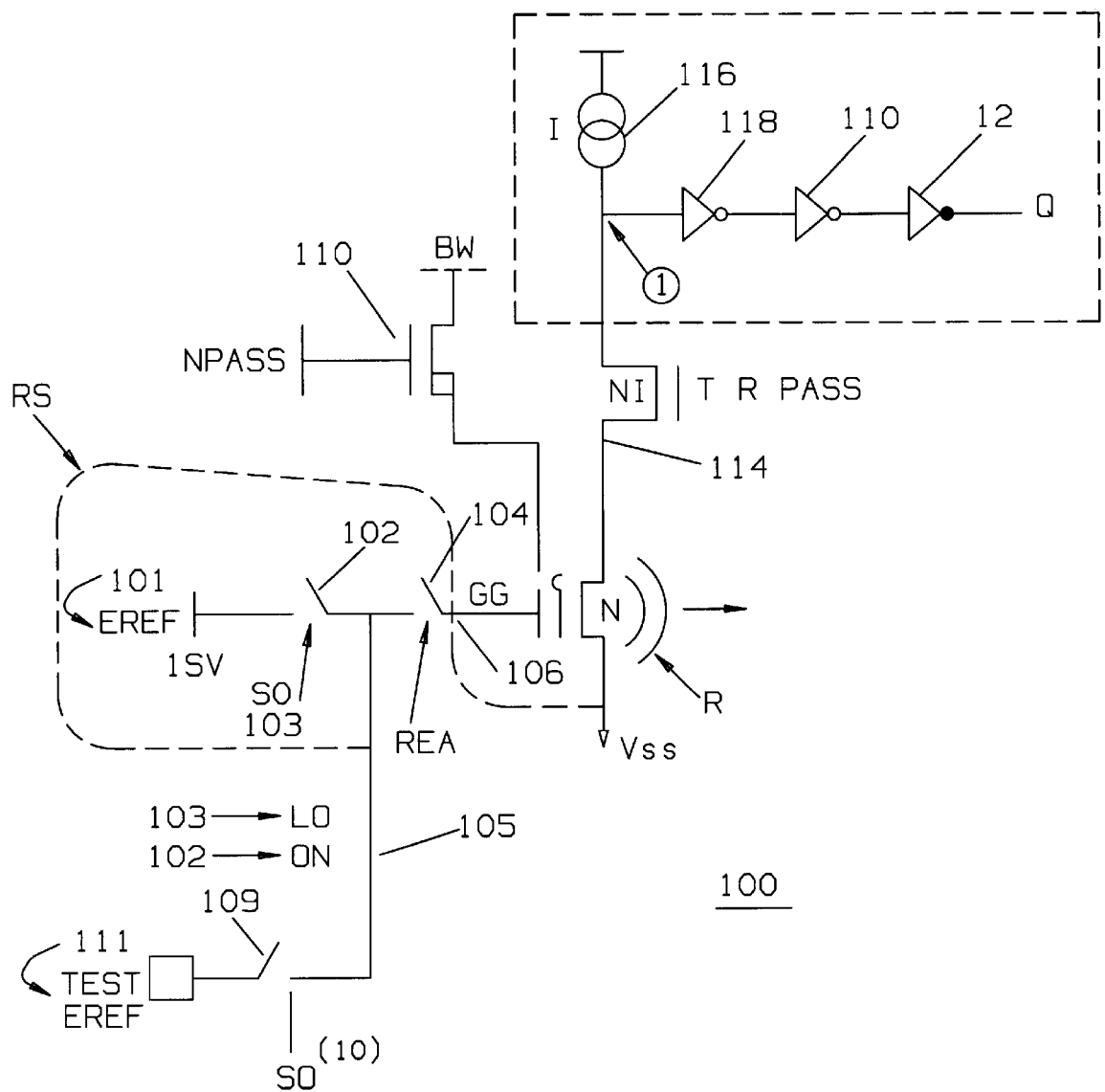
FIG. 1b illustrates testing of an EEPROM via conventional methodology.

To further describe the problems in testing an array, refer now to FIG. 1b and the accompanying description. FIG. 1b illustrates a conventional method for testing the array 10. FIG. 1b includes a portion of the array 10, namely a read select element 16, a write select element 12, a sense amplifier 16 and a bit cell 12. As is seen, the read select 16 comprises a reference voltage EREF which is coupled to a switch 102. The reference voltage is typically 1.5 volts. Switch 102 is controlled by signal 103.

Figure 1C:
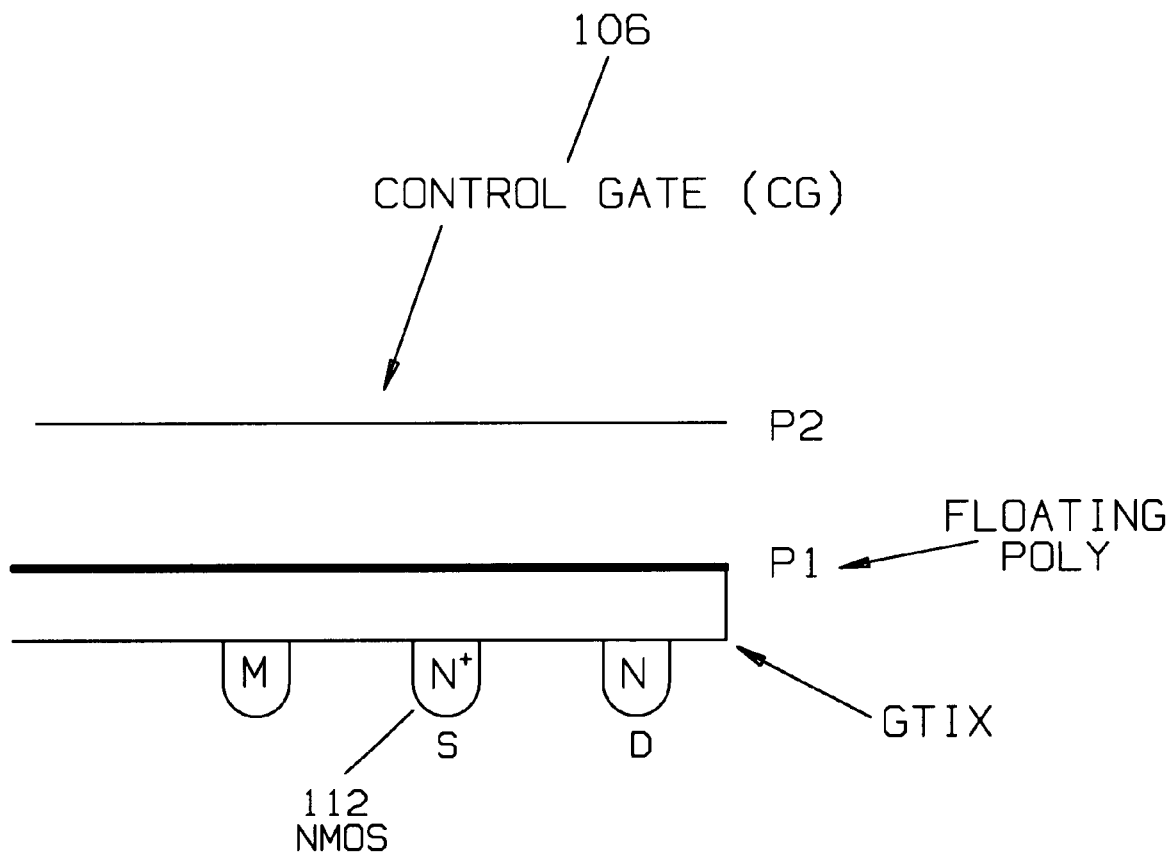
FIG. 1c illustrates a transistor which includes a control gate.

A second switch 104 is coupled to switch 102, and is controlled by a second signal 105. The control gate of 106 of device 112 is coupled to the second switch 104. A second transistor 110 is coupled to the transistor 106. Transistor 114 is coupled to the sense amplifier 16. The sense amplifier includes a current source 116, which is coupled at node 1 to transistor 114 and includes a plurality of inverters 118, 110 and 120 which provide the output. Transistor 112 is the basic core of the memory. FIG. 1c illustrates transistor 112 which includes a control gate 100. Accordingly, in a preferred embodiment if the threshold voltage of the transistor is 2 v and a threshold voltage above 7 volts the device is low. Referring back to FIG. 1b, transistors 110 and 114 are pass transistors. Transistor 110 is a high frequency voltage device and transistor 114 is a typical transistor device. There is a test voltage (Test EREF) 111 provided from outside the device.

Figure 1D:
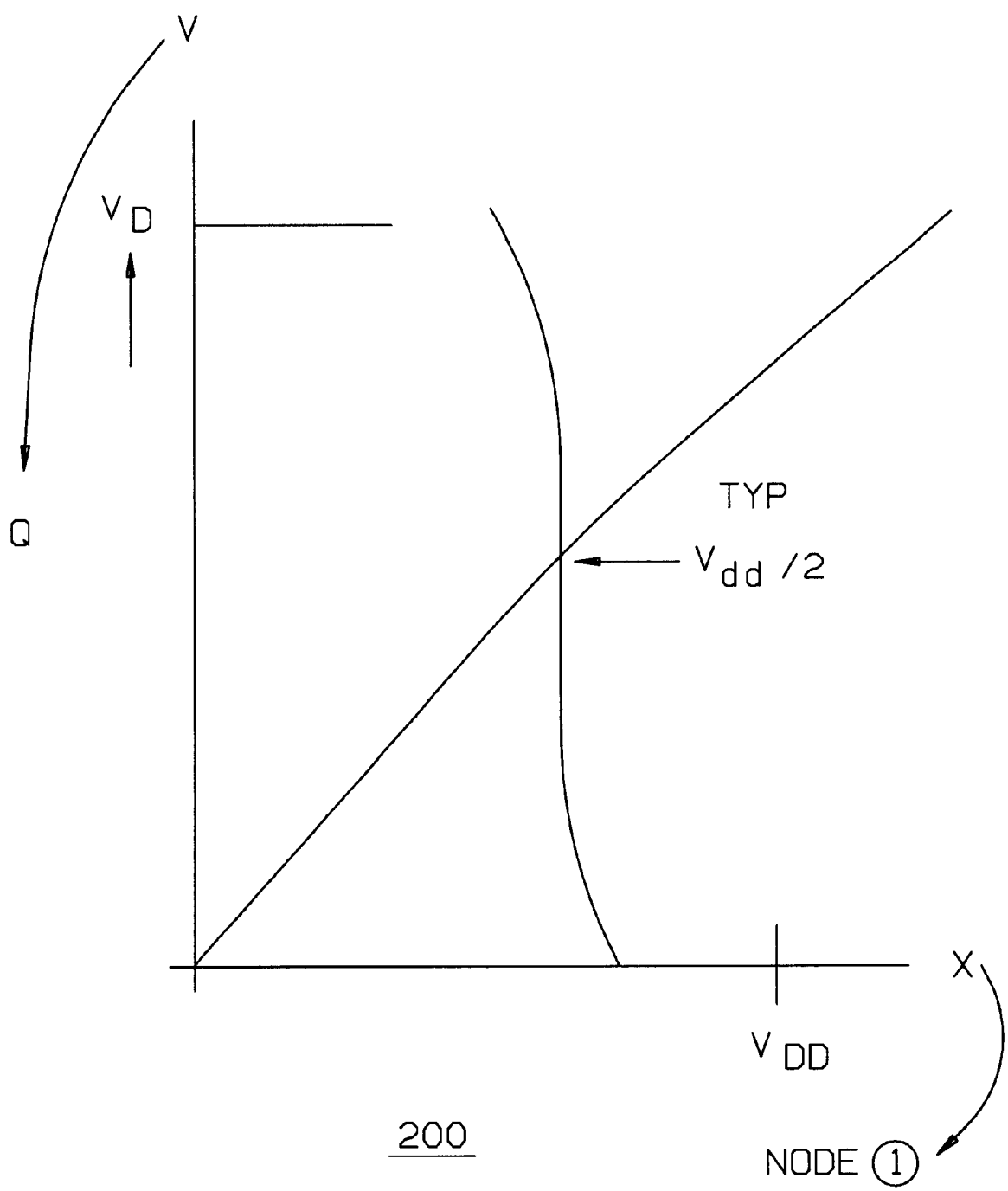
FIG. 1d illustrates a transfer characteristic of the three inverters 118, 110 & 12 of FIG. 2.
Figure 2:
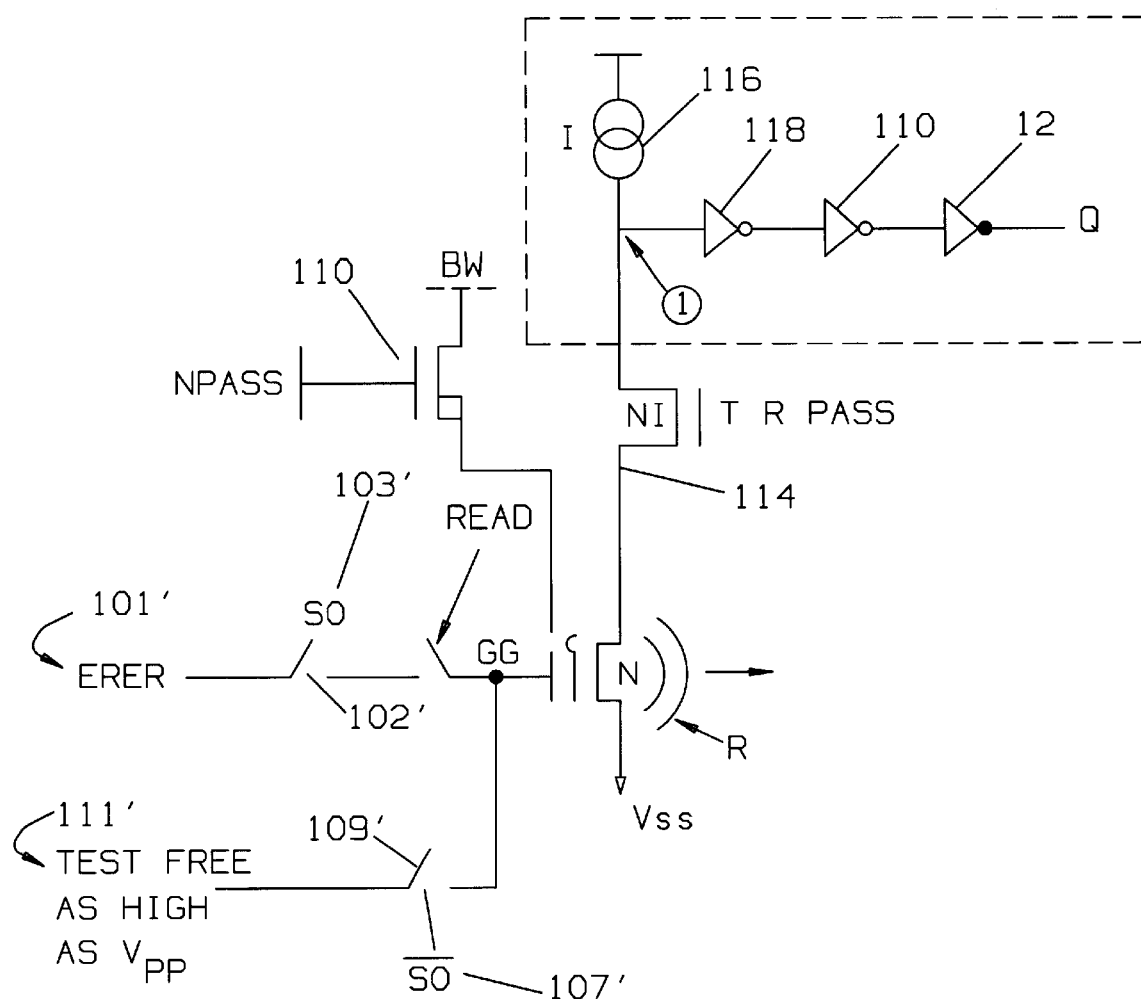
FIG. 2 illustrates a second conventional system for testing an EEPROM.

Referring to FIG. 1d, what is shown is a transfer characteristic of the three inverters 118, 110 & 12 of FIG. 2. Accordingly, the x-axis is the node 1 of FIG. 2 and y-axis is Q of FIG. 2. The threshold voltage/trip point at the node 1 is typically $V_{dd}$ divided by 2. This is measured at node 1 of FIG. 1b when Q changes. Test EREF is used to measure the internal voltage and determine look at the threshold voltage required to turn on the transistor 112. Referring back to FIG. 1b, since Test EREF is known, the SO 105 plus the SO 102 signals together provide the indication of whether the device is meeting its threshold requirements.

FIG. 2 illustrates a second conventional testing method in which the test reference voltage is as high as $V_{pp}$. However, this testing method allows for the determination that if the device has gone from logic 0 to logic 1 at an output, but it does not detect whether the device has gone from logic 1 to a logic zero.

Accordingly, using the conventional system the objective is to test the device for leaking when the device goes from logic 1 (−2 volts) to logic 0 (7 volts). Using conventional methods a voltage is connected to the EREF pin and assuming the $V_{trip}$ point of the device is approximately 2.5V. From this information, all that can be determined about the threshold voltage ($V_t$) is that it is less than 0 volts. The EREF_TEST pin can only be taken to a point that is approximately 300 mv below ground due to diode to $V_{ss}$, so accordingly, in a conventional system $V_t$ has to move very positive to show change in the output from logic 1 to logic 0. Accordingly, a very leaky EEPROM is required to show a change from logic 1 to logic 0 and also a very long bake time is required in the conventional system, for example, up to several days, to determine that the EEPROM is leaky.

Accordingly, a system and method in accordance with the present invention addresses this drift problem by testing the characteristics of the memory array on a bit by bit basis. A system and method in accordance with the present invention includes a mirrored current source arrangement. The mirrored current source arrangement allows for the determination of the overall change in characteristic of the threshold voltage. In so doing, the device can be tested more accurately and quickly, thereby reducing the time for testing and increasing the reliability of the device.

Figure 3:
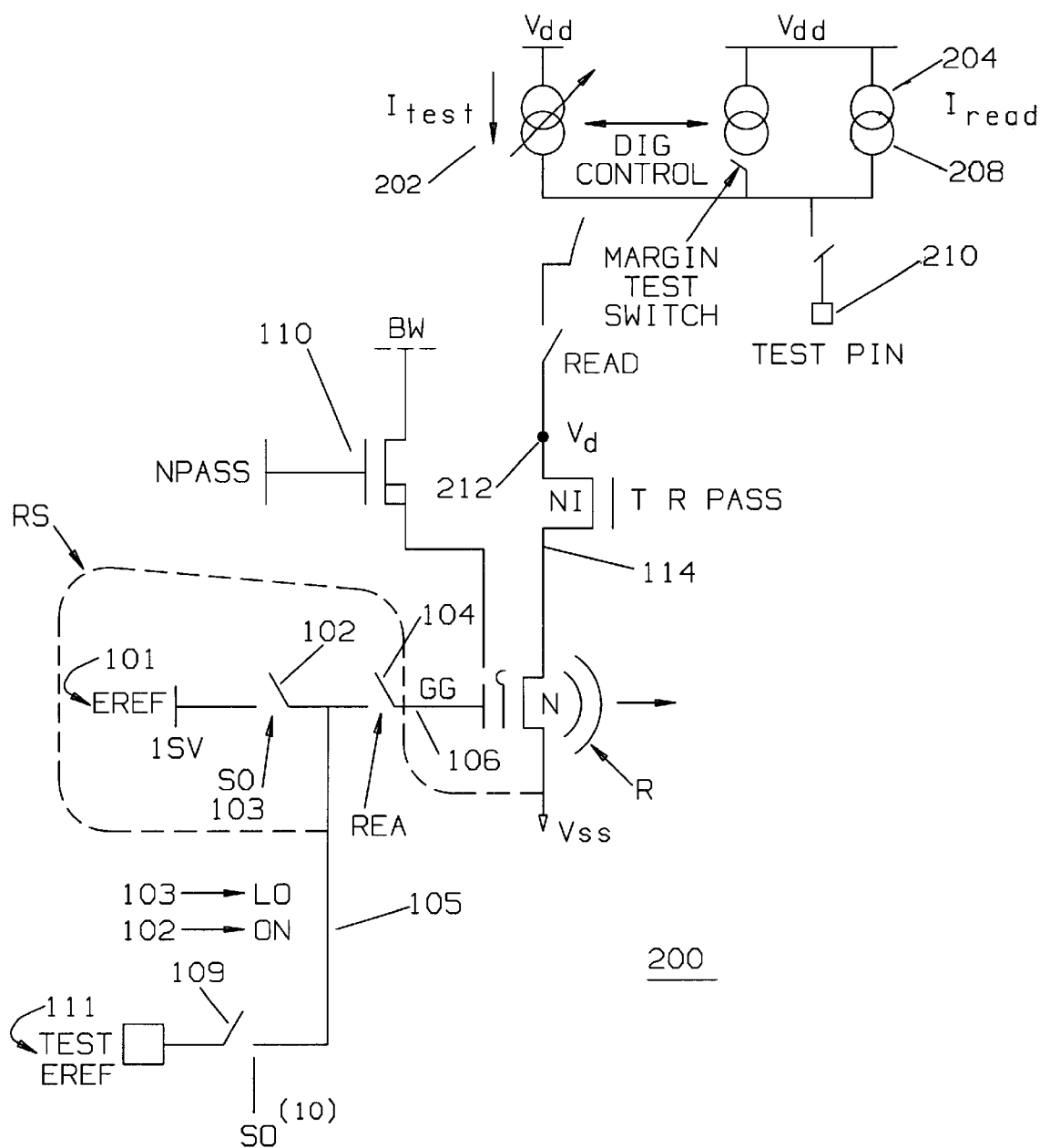
FIG. 3 illustrates a system for testing an EEPROM in accordance with the present invention.

To more particularly describe the invention, refer now to the following discussion along with the accompanying figures. FIG. 3 illustrates a system 200 for testing in accordance with the present invention. The component that are similar to that of FIG. 1b are provided with similar reference numerals. The system 200 includes a controllable current source 202 and mirrored current source arrangement 204 coupled to the current source 202. The mirrored current source arrangement comprises first and second parallel coupled current sources 206 and 208 which are coupled to a test pin 210. Accordingly, through mirrored current arrangement the current through node 220 can be measured. Accordingly, this measurement allows for the determination of a variation in current to be determined. In so doing, the overall characteristics of the bit cell can be ascertained. Therefore, a small change in $V_t$ can be detected to more quickly determine if the device is leaky. To describe this feature in more detail, refer now to the following discussion.

A system in accordance with the present invention allows for the determination of the current through the device test pin, a change in $I_D$ can be measured which will in turn provide more accurate information regarding the shift in the threshold voltage than utilizing conventional test circuits.

Figure 4:
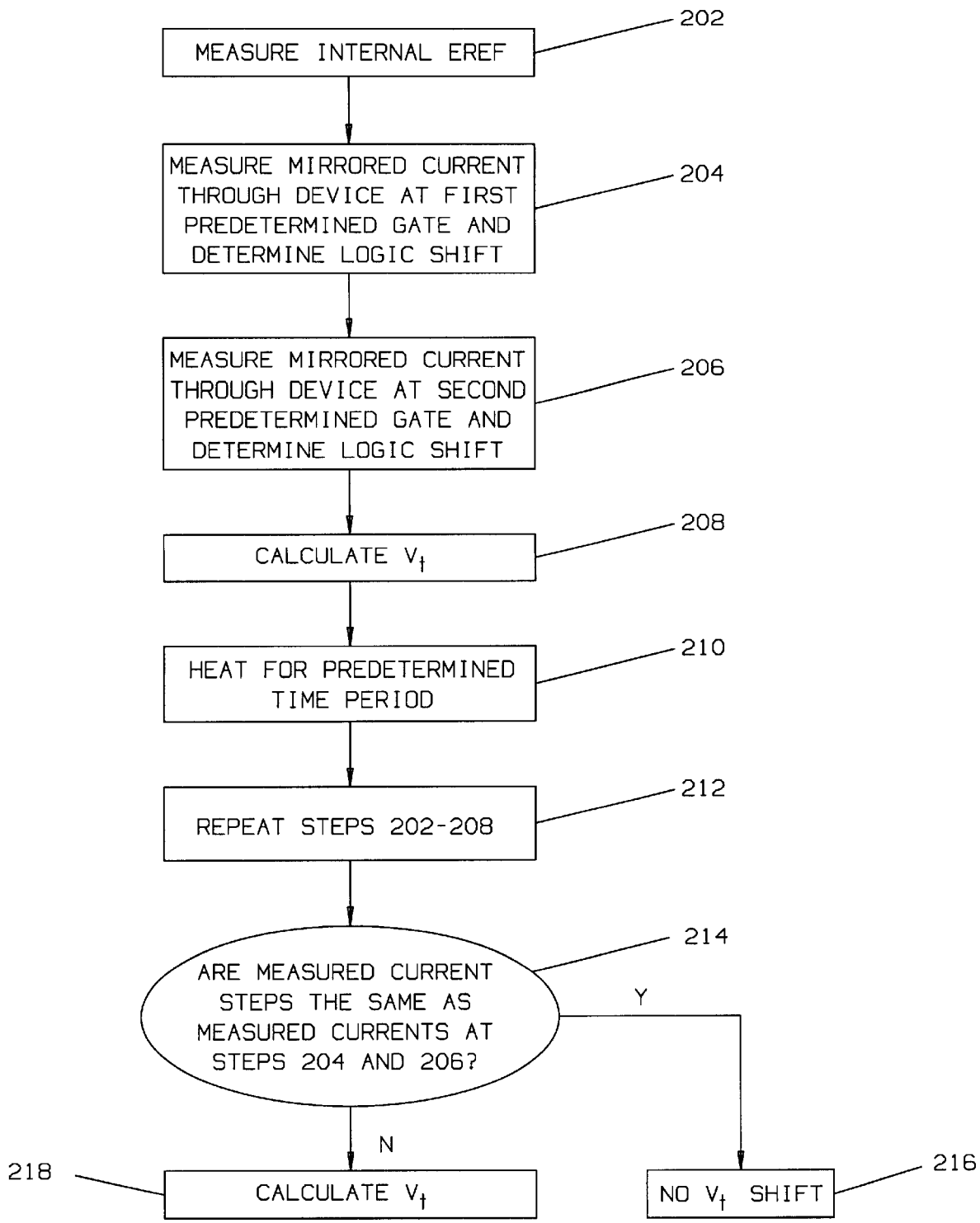
FIG. 4 illustrates a flow chart of the operation of the testing system in accordance with the present invention.

Referring now to FIG. 4, what is shown is a flow chart of the operation of the testing system in accordance with the present invention. First, SO1 and SO2 are turned on to measure the internal EREF, as is done in the conventional system, via step 202. The mirrored current is then measured with the gate voltage at a first predetermined level (for example, 0 volt) and then the gate voltage at a second predetermined level (for example, 1 volt) to determine when device shifts from logic 1 to logic 0, via step 204. Thereafter, the mirrored current is measured again with the gate voltage at a second predetermined level (1 volt) and a determination is made as to when device shifts from logic 1 to logic 0, via step 206. From these two measurements the $V_t$ can be calculated, via step 208. Thereafter, the circuit is heated or baked for a predetermined period of time, via step 210, and the steps 204 and 206 are repeated, via step 212. Next, the second set of measurements are compared to the first set of measurements, via step 214. If the measured values are the same then it is determined that $V_t$ has not shifted, via step

214. If on the other hand, the current measurements have changed, then a shift in $V_t$ has occurred that can be calculated, via step 214.

Therefore, through this system, $V_t$ can be determined when $V_t$ is less than 0 volts and also shifts in the value of $V_t$ can be more easily detected. Therefore the current, the transfer characteristics, the $V_t$ and EREF, can be determined based on $V_{dd}$ and temperature in a more efficient manner.

Accordingly, the characteristics of device can be determined by this repeated comparison of $I_d$ at $V_G=0$ and $V_G=1$ volt after a predetermined bake time. Since $I_{test}$ and $I_{read}$ are known values, the $V_t$ shift can be determined via the above-identified equation. Therefore, it can be a small shift in $V_t$ can be extrapolated from this change in current. Accordingly, more information about the device can be obtained through this margin test control circuit to determine whether a device is leaky more quickly than utilizing a conventional testing system.

To more particularly describe the present invention in the context of an example, please refer to the following. The equation for total current $$I_D = I_{read} + I_{test} = K/2(Vcs-Vt)^2(1+\lambda Vds) \quad (1)$$

where k=w/L$\mu$ Cox $\lambda$=constant $I_{read}$ is first measured to confirm its value for example (20 $\mu$A). This is accomplished using the test pin and turning the margin test switch off. Accordingly, more information about $V_t$ can be obtained by adding additional current ($I_{test}$) along with $I_{read}$. In a preferred embodiment enough current is added to ensure that the system will go from logic 1 to logic 0. Accordingly, if 200 $\mu$A is added to the drain of the device $V_o$ logic will switch to logic zero.

Accordingly, it is known that with test margin voltage ($V_G$)=0, $I_{read}$=20 $\mu$A, $V_o$ is a logic 1; and with $V_G$=-, $I_{read}$=220 $\mu$A, $V_o$ is logic 0.

Therefore, if $V_{trip}$ of the device is 2.5 volts, $I_{test}$ can be adjusted such that $V_t$ is switched from logic 1 to 0 or vice versa. Assuming $\lambda$=0.1 and $V_{trip}$=2.5V, it can be determined that $I_d$=50 $\mu$A. Accordingly, since it is known that $I_{read}$=20 $\mu$A, then $I_{test}$=30 $\mu$A (i.e., $I_d-I_{tread}$). Accordingly, a measured amount of current $I_{test}$ can be added to $I_{read}$ to the precise point that $V_t$ switches from logic 1 to logic 0 or vice versa. For example, in this embodiment, when $V_G$=0 it is observed that $I_{test}$=30 $\mu$A when $V_t$ toggles between logic 1 and logic 0. Next it can be determined what the characteristics of the device are when $V_G$=1 volt. It is observed that Vo toggles between logic 1 and logic 0 when Itest=92.5 $\mu$A.

Accordingly, there are two equations with two unknowns. They are shown below:

$$I_{D1} = 30 \mu A + 20 \mu A = k/2(0-V_t)^2(1-\lambda V_{trip})$$

$$I_{D2} = 92.5 \mu A + 20 \mu A = k/2(1-V_t^2)(1-\lambda V_{trip})$$

By dividing both of the equations, the result is:

$$50 \mu A/112.5 \mu A = (-V_t)^2/(1-V_t)^2$$

$$(1-V_t)^2 = 2.25 V_t^2$$

It can then be determined that therefore $V_t$=-2V

This process of testing $I_D$ at $V_G$=0 and $V_G$=1 volt is performed again after leaking. Typically, the bake time is 20 minutes at 400° C. If the $V_t$ shifts from -2 volts to 1.5 volts, then when $I_d$ is measured at $V_G$=0, the $I_d$ is 28 $\mu$A, and when $I_d$ is measured at $V_G$=1, $I_d$ is at 62.5 $\mu$A for example. Accordingly, the $V_t$ shift can be discovered due to the change in current and the use of the above-identified equation (1).

In a preferred embodiment, the shift in the $V_t$ of the bit cell is limited only by the accuracies of the digital control of $I_{test}$ current noise level at the input of the sense amplifier in measured errors and matching characteristics of the current sources. All of the above limitations at most limit measurements to 1 percent of the real value of $V_t$ or a delta of 20 microvolts to 50 microvolts.

Accordingly, a system and method in accordance with the present invention addresses this drift problem by testing the characteristics of the memory array on a bit by bit basis. A system and method in accordance with the present invention includes a mirrored current source arrangement. The mirrored current source arrangement allows for the determination of the overall change in characteristic of the threshold voltage. In so doing, the device can be tested more accurately and quickly, thereby reducing the time for testing and increasing the reliability of the device.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for testing a cell in a device for reliability, the cell being coupled to a reference voltage and a current source; the method comprising the steps of:
    (a) measuring an internal reference voltage;
    (b) measuring a first mirrored current through the device at first predetermined gate voltage;
    (c) measuring a second mirrored current through the device at a second predetermined voltage;
    (d) determining the threshold voltage of the cell;
    (e) heating the device for a predetermined period of time; and
    (f) calculating a new threshold voltage if either the first or the second measured mirrored current is different from the first or the second measured mirrored current of steps (b) and (c).

2. The method of claim 1 wherein the first predetermined gate voltage comprises approximately 0 volts.

3. The method of claim 2 wherein the second predetermined gate voltage comprises 1 volt.

4. The method of claim 1 wherein the measuring a first mirrored current step (b) comprises the steps of:
    (b1) providing a known current to the device; and
    (b2) providing a first test current to the device to a point where the device toggles from logic 1 to logic 0, wherein the first mirrored current comprises the first known current and the first test current.

5. The method of claim 4 wherein the measuring a first mirrored current step (b) comprises the steps of:
    (b3) providing the known current to the device; and
    (b4) providing a second test current to the device to a point where the device toggles from logic 1 to logic 0, wherein the second mirrored current comprises the second known current and the second test current.

6. The method of claim 5 wherein the device is heated to approximately 400° C. after approximately 20 minutes.

7. The system of claim 5 wherein the device is heated to approximately 400° C. after approximately 20 minutes.

8. A system for testing a cell in a device for reliability, the cell being coupled to a reference voltage and a current source; the method comprising the steps of:

means for measuring an internal reference voltage;

means for measuring a first mirrored current through the device at first predetermined gate voltage;

means for measuring a second mirrored current through the device at a second predetermined voltage;

means for determining the threshold voltage of the cell;

means for heating the device for a predetermined period of time; and means for calculating a new threshold voltage if either the first or the second measured mirrored current is different from the first or the second measured mirrored current measured earlier.

9. The system of claim 8 wherein the first predetermined gate voltage comprises approximately 0 volts.

10. The system of claim 9 wherein the second predetermined gate voltage comprises 1 volt.

11. The system of claim 8 wherein the measuring a first mirrored current means comprises:

means for providing a known current to the device;

means for providing a first test current to the device to a point where the device toggles from logic 1 to logic 0, wherein the first mirrored current comprises the first known current and the first test current.

12. The system of claim 11 wherein measuring a first mirrored current means comprises:

means for providing the known current to the device; and means for providing a second test current to the device to a point where the device toggles from logic 1 to logic 0, wherein the second mirrored current comprises the second known current and the second test current.

* * * * *